United States Patent
Hester et al.

(10) Patent No.: US 8,269,475 B2
(45) Date of Patent: Sep. 18, 2012

(54) CLASS DH AMPLIFIER

(75) Inventors: Richard K. Hester, Dallas, TX (US);
Patrick P. Siniscalchi, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 641 days.

(21) Appl. No.: 12/372,139

(22) Filed: Feb. 17, 2009

(65) Prior Publication Data
US 2010/0207592 A1 Aug. 19, 2010

(51) Int. Cl.
*G05F 1/00* (2006.01)

(52) U.S. Cl. ........ 323/288; 323/283; 323/285; 330/253; 330/260; 330/297

(58) Field of Classification Search .................. 323/268, 323/271, 274, 275, 280, 282, 283, 284, 285, 323/288; 330/251, 253, 260, 10, 297
See application file for complete search history.

(56) References Cited

U.S. PATENT DOCUMENTS

| | | | | |
|---|---|---|---|---|
| 4,393,395 A * | 7/1983 | Hacke et al. | | 348/642 |
| 4,409,535 A * | 10/1983 | Hickman | | 318/811 |
| 4,926,140 A * | 5/1990 | Schenberg | | 331/1 A |
| 4,938,223 A * | 7/1990 | Charters et al. | | 607/46 |
| 5,563,781 A * | 10/1996 | Clauter et al. | | 363/124 |
| 5,898,340 A * | 4/1999 | Chatterjee et al. | | 330/251 |
| 6,091,222 A * | 7/2000 | Vertemara et al. | | 318/701 |
| 6,262,632 B1 * | 7/2001 | Corsi et al. | | 330/251 |
| 7,057,381 B2 * | 6/2006 | Harriman et al. | | 323/285 |
| 7,170,340 B1 * | 1/2007 | Bhatt et al. | | 330/10 |
| 7,342,328 B1 * | 3/2008 | Eddleman | | 307/80 |
| 7,468,631 B1 * | 12/2008 | Sutardja | | 330/207 A |
| 7,592,934 B1 * | 9/2009 | Bourstein et al. | | 341/100 |
| 7,795,970 B2 * | 9/2010 | Kaya et al. | | 330/251 |
| 2006/0028272 A1 * | 2/2006 | Ozawa et al. | | 330/251 |
| 2008/0165830 A1 | 7/2008 | Tai | | |
| 2008/0175404 A1 | 7/2008 | Bank et al. | | |
| 2008/0211578 A1 * | 9/2008 | Morishima | | 330/251 |
| 2008/0284508 A1 | 11/2008 | Walker et al. | | |

FOREIGN PATENT DOCUMENTS

EP 1 320 927 6/2003
WO 2008144134 11/2008

* cited by examiner

*Primary Examiner* — Jessica Han
*Assistant Examiner* — Lakaisha Jackson
(74) *Attorney, Agent, or Firm* — John J. Patti; Wade J. Brady, III; Frederick J. Telecky, Jr.

(57) ABSTRACT

A class DH amplifier is provided. The amplifier is generally comprised of a tracking power supply, a class D amplifier section, and a carrier generator. The tracking power supply receives a supply voltage and an analog input signal, and the tracking power supply provides an input for the carrier generator. Based on its input from the tracking power supply, the carrier generator can output a positive ramp signal and a negative ramp signal to the class D amplifier section. The class D amplifier section can generate an output signal base on the analog input signal and the ramp signals from the carrier generator.

18 Claims, 5 Drawing Sheets

CLASS DH AMPLIFIER

TECHNICAL FIELD

The invention relates generally to amplifiers and, more particularly, to audio and motor control amplifiers.

BACKGROUND

There are numerous types of amplifiers. In fact, there are several classes of amplifiers, such as classes A, B, AB, C, D, E, F, G, and H. These types of amplifiers have been implemented in various devices. Some examples of conventional device and/or amplifiers are European Patent No. 1320927; U.S. Patent Pre-Grant Pub. No. 2008/0165830; U.S. Patent Pre-Grant Pub. No. 2008/0175404; U.S. Patent Pre-Grant Pub. No. 2008/0284508; and PCT. Pub. No. WO2008144134.

SUMMARY

In accordance with a preferred embodiment of the present invention, an apparatus is provided, The apparatus comprises a power supply that receives a supply voltage and the analog input signal and that outputs a positive regulated signal and a negative regulated signal; a carrier generator that receives the positive regulated signal and the negative regulated signal and that outputs a positive ramp signal and a negative ramp signal; a pulse generator that receives the analog input signal, the positive ramp signal, and the negative ramp signal and that outputs a plurality of pulse width modulation (PWM) signals; and a power stage that receives the plurality of PWM signals, the positive regulated signal, and the negative regulated signal and that outputs the output signal.

In accordance with a preferred embodiment of the present invention, the positive regulated signal is the greater of a first predetermined value and a first value within a first predetermined range above the output signal, and wherein the negative regulated signal is the lesser of a second predetermined value and a second value within a second predetermined range below the output signal.

In accordance with a preferred embodiment of the present invention, the pulse generator further comprises a subtractor that outputs a difference between the analog input signal and the output signal; an integrator that receives the difference between the analog input signal and the output signal; a first comparator that receives an output from the integrator and the positive ramp signal; a second comparator that receives the output from the integrator and the negative ramp signal; and switch control logic that receives outputs from the first and second comparators and that outputs the plurality of PWM signals.

In accordance with a preferred embodiment of the present invention, the power stage further comprises three transistors, wherein each transistor receives at least one PWM signal at its control electrode.

In accordance with a preferred embodiment of the present invention, the three transistors further comprise n-channel enhancement mode MOSFETs.

In accordance with a preferred embodiment of the present invention, an apparatus is provided. The apparatus comprises a tracking power supply that receives a supply voltage and an analog input signal; a carrier generator that receives an output from the tracking power supply and that outputs a positive ramp signal and a negative ramp signal, wherein the amplitudes of positive and negative ramp signals are proportional to the output of the tracking power supply; and a class D amplifier section that receives the analog input signal, the positive ramp signal, and the negative ramp signal and that outputs an output signal.

In accordance with a preferred embodiment of the present invention, the tracking power supply further comprises a switch-mode power supply that receives the supply voltage and the analog input signal and that outputs the positive regulated signal and the negative regulated signal, wherein the positive regulated signal is the greater of a first predetermined value and a first value within a first predetermined range above the output signal, and wherein the negative regulated signal is the lesser of a second predetermined value and a second value within a second predetermined range below the output signal.

In accordance with a preferred embodiment of the present invention, the class D amplifier section further comprises a pulse generator that receives the analog input signal, the positive ramp signal, and the negative ramp signal and that outputs a plurality of PWM signals; and a power stage that receives the plurality of PWM signals, the positive regulated signal, and the negative regulated signal and that outputs the output signal.

In accordance with a preferred embodiment of the present invention, an apparatus is provided. The apparatus comprises a power supply that receives a supply voltage and an analog input signal and that outputs a positive regulated signal and a negative regulated signal, wherein the positive regulated signal is the greater of a first predetermined value and a first value within a first predetermined range above the output signal, and wherein the negative regulated signal is the lesser of a second predetermined value and a second value within a second predetermined range below the output signal; a carrier generator including: a phase section that receives the positive regulated signal and a positive ramp signal and that generates a plurality of phase signals; a positive ramp generator that receives the positive regulated signal and the plurality of phase signals and that outputs the positive ramp signal; and a negative ramp generator that receives the negative regulated signal and the plurality of phase signals and that outputs a negative ramp signal; a pulse generator that receives the analog input signal, the positive ramp signal, and the negative ramp signal and that outputs a plurality of PWM signals; and a power stage that receives the plurality of PWM signals, the positive regulated signal, and the negative regulated signal and that outputs an output signal.

In accordance with a preferred embodiment of the present invention, the power supply is a switched-mode power supply.

In accordance with a preferred embodiment of the present invention, the phase section further comprises a first comparator that receives the positive regulated voltage and the positive ramp signal; a second comparator that receives the ground and the positive ramp signal; a first NOR gate that receives an output from the first comparator, that receives a second phase signal of the plurality of phase signals and that outputs a first phase signal of the plurality of phase signals; and a second NOR gate that receives an output from the second comparator, that receives the first phase signal, and that outputs the second phase signal.

In accordance with a preferred embodiment of the present invention, the power stage further comprises a first FET that receives the positive regulated signal at is drain, a first PWM signal of the plurality of PWM signals at its gate; a second FET that is coupled to ground at is source, a second PWM signal of the plurality of PWM signals at its gate; and a third FET that receives the negative regulated signal at is source, a third PWM signal of the plurality of PWM signals at its gate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
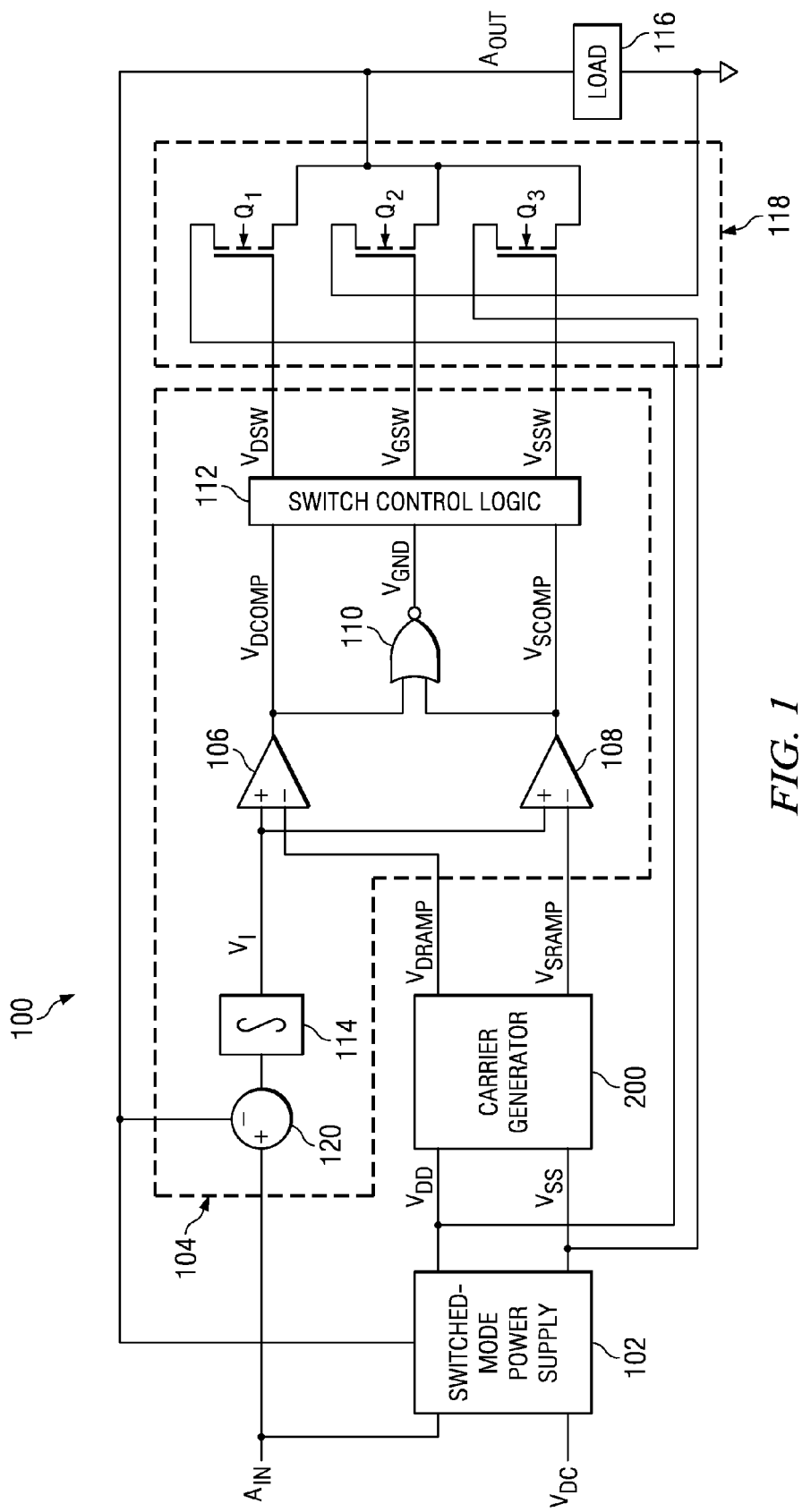
FIG. 1 is a block diagram of a class DH amplifier in accordance with an embodiment of the invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates a class DH amplifier in accordance with an embodiment of the invention. The amplifier 100 is generally comprised of a tracking power supply, a carrier generator 200, and a class D amplifier section. The tracking power supply generally includes a switch-mode power supply 102, while the class D amplifier section generally includes a pulse generator 104 and a power stage 118.

Figure 3:
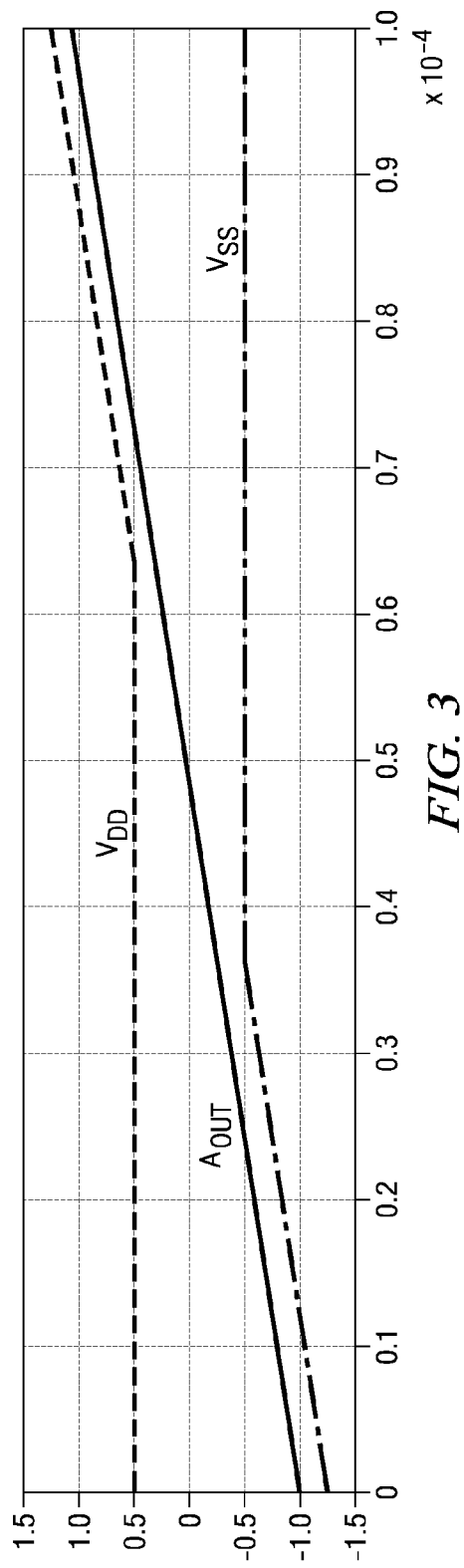
FIG. 3 is a graph depicting the positive regulated signal $V_{DD}$, the negative regulated signal $V_{SS}$, and the output signal $A_{OUT}$ of FIG. 1.

In operation, power supply 102, preferably, receives an analog input signal $A_{IN}$ (and/or the output signal $A_{OUT}$) and a supply voltage $V_{DC}$ and, preferably, outputs the positive regulated signal $V_{DD}$ and the negative regulated signal $V_{SS}$. As can be seen in FIG. 3, the positive and negative regulated signals $V_{DD}$ and $V_{SS}$ are generally a predetermined value or generally track the output signal $A_{OUT}$ (remaining within a predetermined band or range from the output signal $A_{OUT}$). Preferably, the positive regulated signal $V_{DD}$ is maintained at a generally constant voltage level (generally about 0.6V) while the output signal $A_{OUT}$ is below a first predetermined threshold (generally about 0.35V), and the positive regulated signal $V_{DD}$ is preferably within a predetermined band or range above the output signal $A_{OUT}$ when the output signal $A_{OUT}$ is above the first predetermined threshold. Preferably, the negative regulated signal $V_{SS}$ is maintained at a generally constant voltage level (generally about −0.6V) while the output signal $A_{OUT}$ above a second predetermined threshold (generally about −0.35V), and the negative regulated signal $V_{SS}$ is preferably within a predetermined band or range below the output signal $A_{OUT}$ when the output signal $A_{OUT}$ is below the second predetermined threshold. Based on the positive and negative regulated signals $V_{DD}$ and $V_{SS}$, the carrier generator 200 can generate positive and negative ramp signals $V_{DRAMP}$ and $V_{SRAMP}$.

Figure 4:
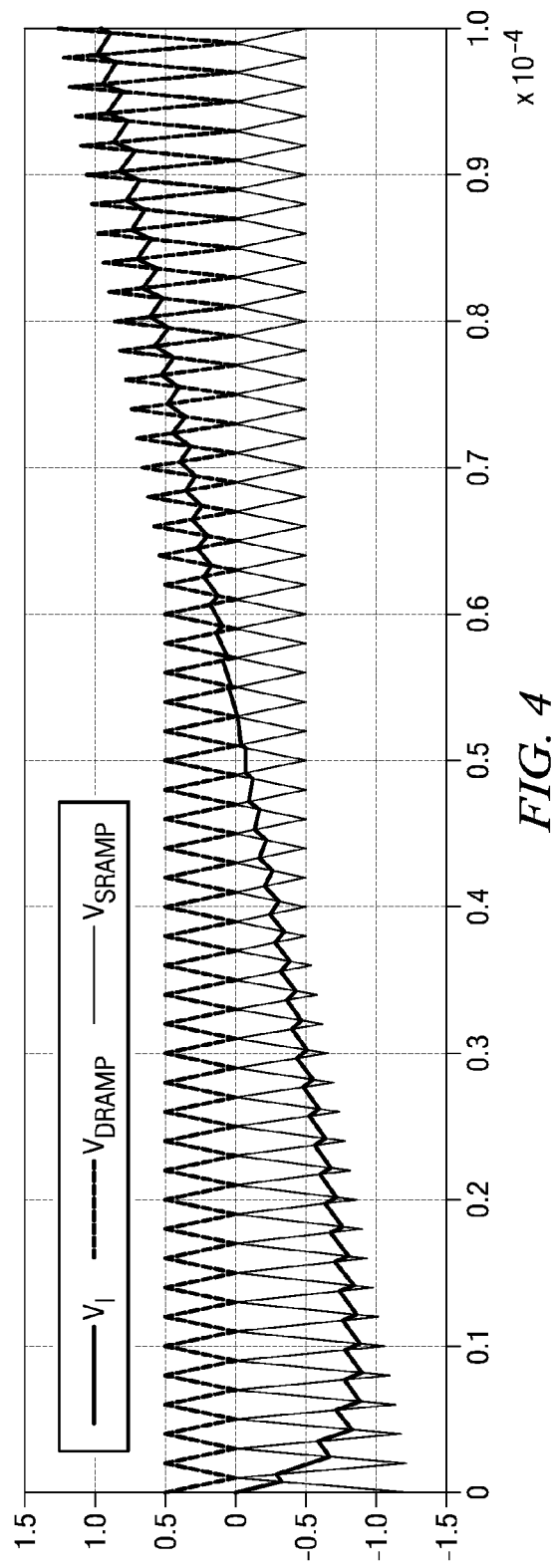
FIG. 4 is a graph depicting the positive ramp signal $V_{DRAMP}$, the negative ramp signal $V_{SRAMP}$, and the integrated signal $V_I$ of FIG. 1.

As can be seen in FIG. 4, the positive and negative ramp signals $V_{DRAMP}$ and $V_{SRAMP}$ generally track the output signal $A_{OUT}$. Preferably, the positive ramp signal $V_{DRAMP}$ has a peak that is proportional to the positive regulated signal $V_{DD}$, and, preferably, the negative ramp signal $V_{SRAMP}$ has a peak that is proportional to the negative regulated signal $V_{SS}$.

Figure 2:
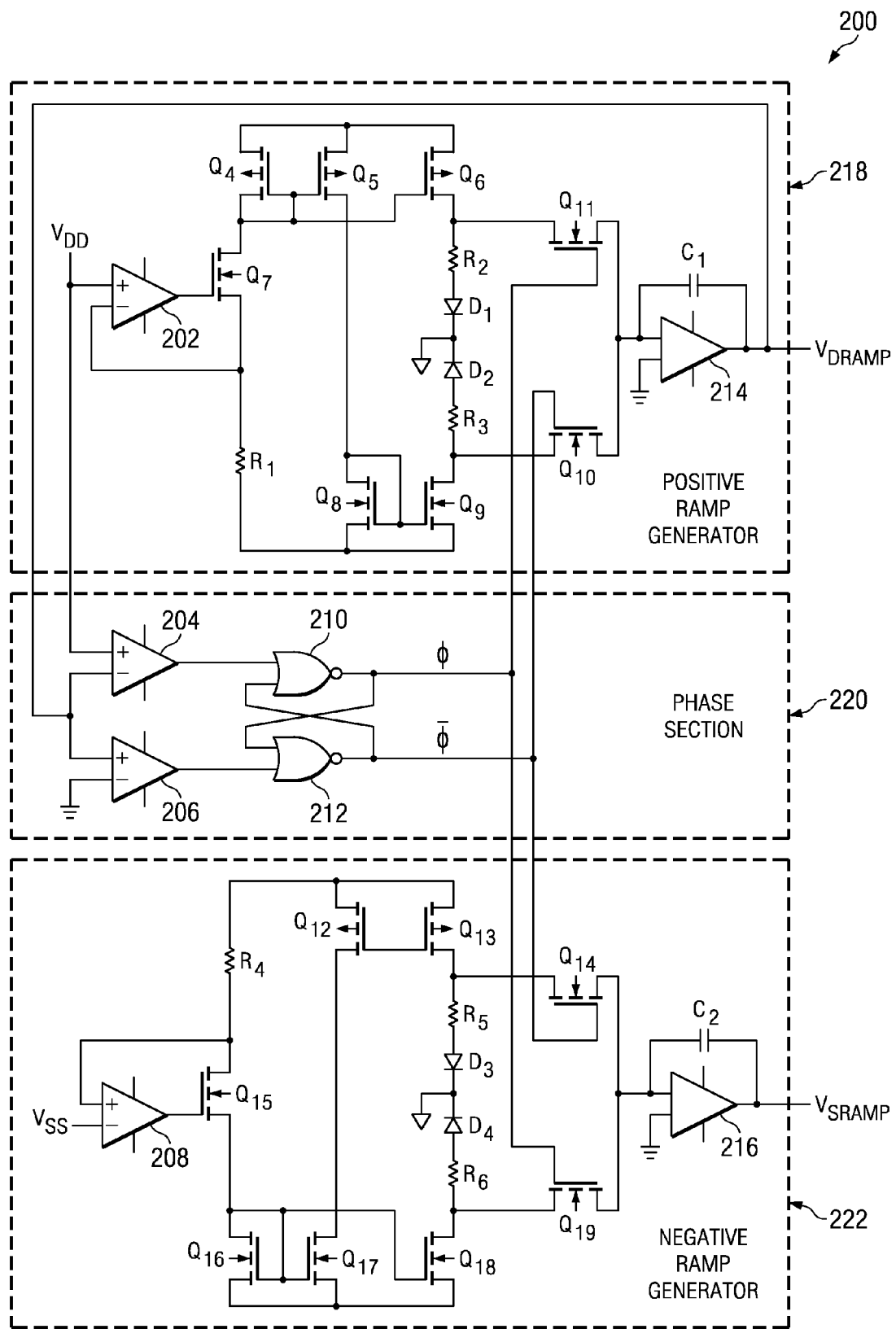
FIG. 2 is a block diagram of an example configuration of the carrier generator of FIG. 1.

To generate the positive and negative ramp signals $V_{DRAMP}$ and $V_{SRAMP}$, various types of carrier generators can be used; however, by way of example, a carrier generator 200 is shown in FIG. 2 in greater detail. The carrier generator 200 is generally comprised of a positive ramp generator 218, a phase section 220, and a negative ramp generator 222.

In operation, the phase section 220 generates phase signals $\phi$ and $\bar{\phi}$, which operate as control signals for the positive ramp generator 218 and the negative ramp generator 222. The phase section 220 is generally comprised of comparators 204 and 206, which each receive the positive ramp voltage $V_{DRAMP}$ as a feedback signal. Preferably, comparator 204 receives the positive ramp signal $V_{DRAMP}$ through its inverting input, while comparator 206 receives the positive ramp signal $V_{DRAMP}$ through its non-inverting input. Additionally, the non-inverting input of comparator 204 preferably receives the positive regulated signal $V_{DD}$, while the inverting input of comparator 206 is grounded. NOR gate 210 can then receive the output from comparator 204 and phase signal $\bar{\phi}$ to generate phase signal $\phi$, and NOR gate 212 can then receive the output from comparator 206 and phase signal $\phi$ to generate phase signal $\bar{\phi}$.

Each of the positive and negative ramp generators 218 and 222 can then generate their respective positive ramp signals $V_{DRAMP}$ and $V_{SRAMP}$ based on the phase signals $\phi$ and $\bar{\phi}$, positive regulated signal $V_{DD}$, and negative regulated signal $V_{SS}$. Positive ramp generator 218 generally comprises amplifier 202, transistors $Q_4$ through $Q_{11}$, resistors $R_1$ through $R_3$, and diodes $D_1$ and $D_2$, and negative ramp generator 222 generally comprises amplifier 208, transistors $Q_{12}$ through $Q_{19}$, resistors $R_4$ through $R_6$, and diodes $D_3$ and $D_4$. In operation, the amplifiers 202 and 208 preferably generate currents that are proportional to the generally instantaneous regulated signals $V_{DD}$ and $V_{SS}$, making ramp signals $V_{DRAMP}$ and $V_{SRAMP}$ generally proportional to regulated signals $V_{DD}$ and $V_{SS}$, respectively. These currents are then transferred to integrators 214 and 216 or are generally shunted based on the phase signals $\phi$ and $\bar{\phi}$, thus generating the ramp signals $V_{DRAMP}$ and $V_{SRAMP}$. Additionally, resistors $R_1$ and $R_4$ should, preferably, have equal values, and capacitors $C_1$ and $C_2$ of integrations 214 and 216 should, preferably, have equal values.

The pulse generator 104 can then receive the analog input signal $A_{IN}$, the output signal $A_{OUT}$, the positive ramp signal $V_{DRAMP}$, the negative ramp signal $V_{SRAMP}$ in order to output a plurality of pulse width modulation (PWM) signals $V_{DSW}$, $V_{GSW}$, and $V_{SSW}$. The pulse generator 104 generally comprises a subtractor 120, an integrator 114, comparators 106 and 108, NOR gate 110, and switch control logic 112. In operation, the subtractor 120 provides a difference between the analog input signal $A_{IN}$ and the output signal $A_{OUT}$ to the integrator 114, which provides an integrated signal $V_I$ to the comparators 106 and 108. Based on the integrated signal $V_I$, the positive ramp signal $V_{DRAMP}$, and the negative ramp signal $V_{SRAMP}$, the comparators 106 and 108 can generate positive and negative comp signals $V_{DCOMP}$ and $V_{SCOMP}$. The positive and negative comp signals $V_{DCOMP}$ and $V_{SCOMP}$, along with a neutral comp signal $V_{GND}$ (the positive and negative comp signals $V_{DCOMP}$ and $V_{SCOMP}$ NORed by gate 110), are generally received by the switch control logic 112 and converted into the positive, negative, and neutral PWM signals $V_{DSW}$, $V_{SSW}$, and $V_{GSW}$.

These PWM signals $V_{DSW}$, $V_{GSW}$, and $V_{SSW}$ can then be used by the power stage 118 to generate an output signal $A_{OUT}$. The power stage 118 is generally comprised of transistors $Q_1$ through $Q_3$. Preferably, each of the transistors $Q_1$ through $Q_3$ is an n-channel enhancement mode MOSFET. As shown, the drain of transistor $Q_1$ receives the positive regulated signal $V_{DD}$ and is actuated at its gate by positive PWM signal $V_{DSW}$. The source of transistor $Q_2$ is generally coupled to ground and is actuated at its gate by neutral PWM signal $V_{GSW}$. Additionally, the source of transistor $Q_3$ receives the negative regulated signal $V_{SS}$ and is actuated at its gate by positive PWM signal $V_{SSW}$. The source of transistor $Q_1$ is tied to the output node. Each of the drains of transistors $Q_2$ through $Q_3$ is preferably coupled to an output node. Thus, as the transistors $Q_1$ through $Q_3$ are actuated to generate the output signal $A_{OUT}$, which can be output to load 116 (i.e., speaker).

Figure 5:
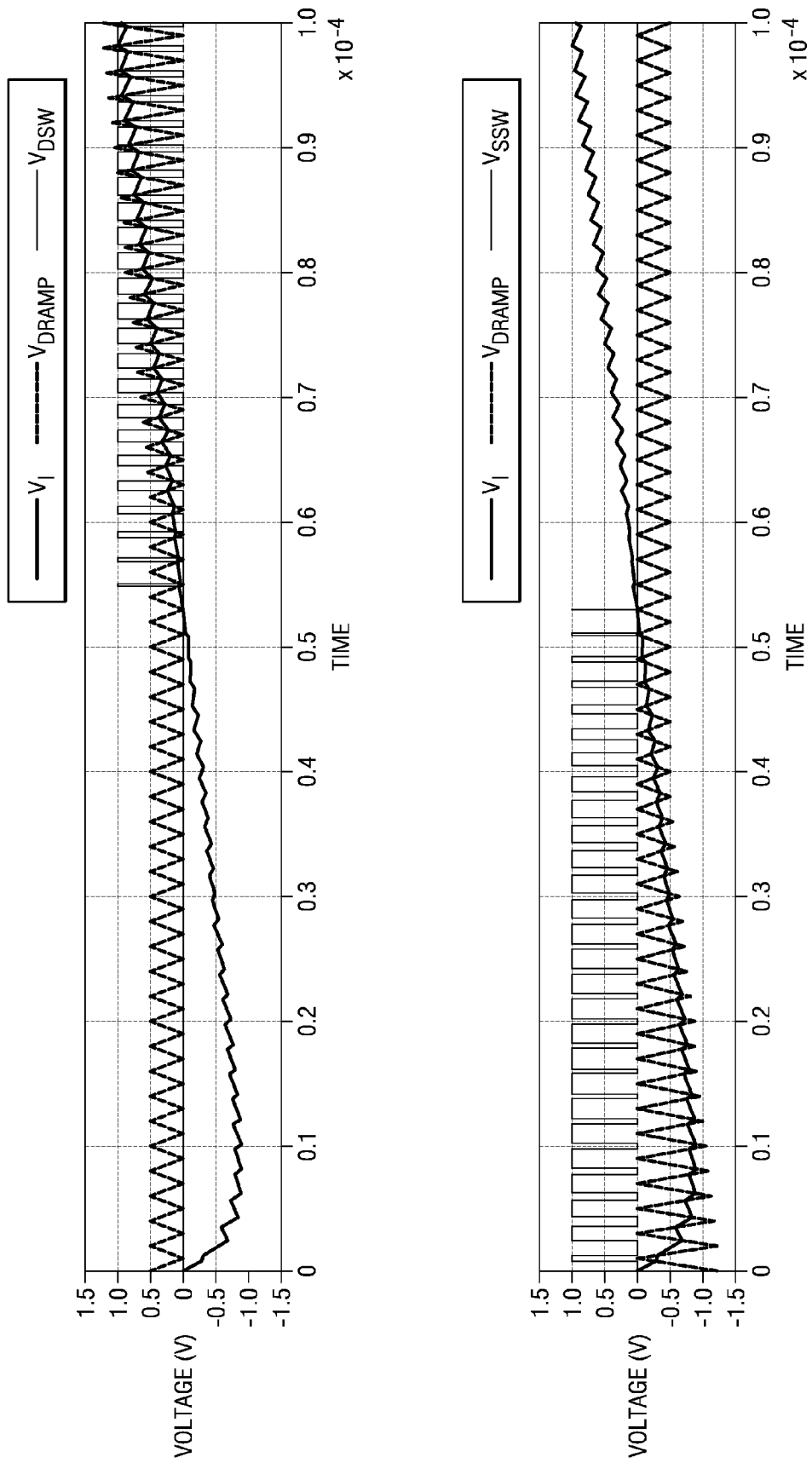
FIG. 5 is a graph depicting the positive ramp signal $V_{DRAMP}$, the negative ramp signal $V_{SRAMP}$, the integrated signal $V_I$, the positive pulse width modulation (PWM) signal $V_{DSW}$, and the negative PWM signal $V_{SSW}$, of FIG. 1.
Figure 6:
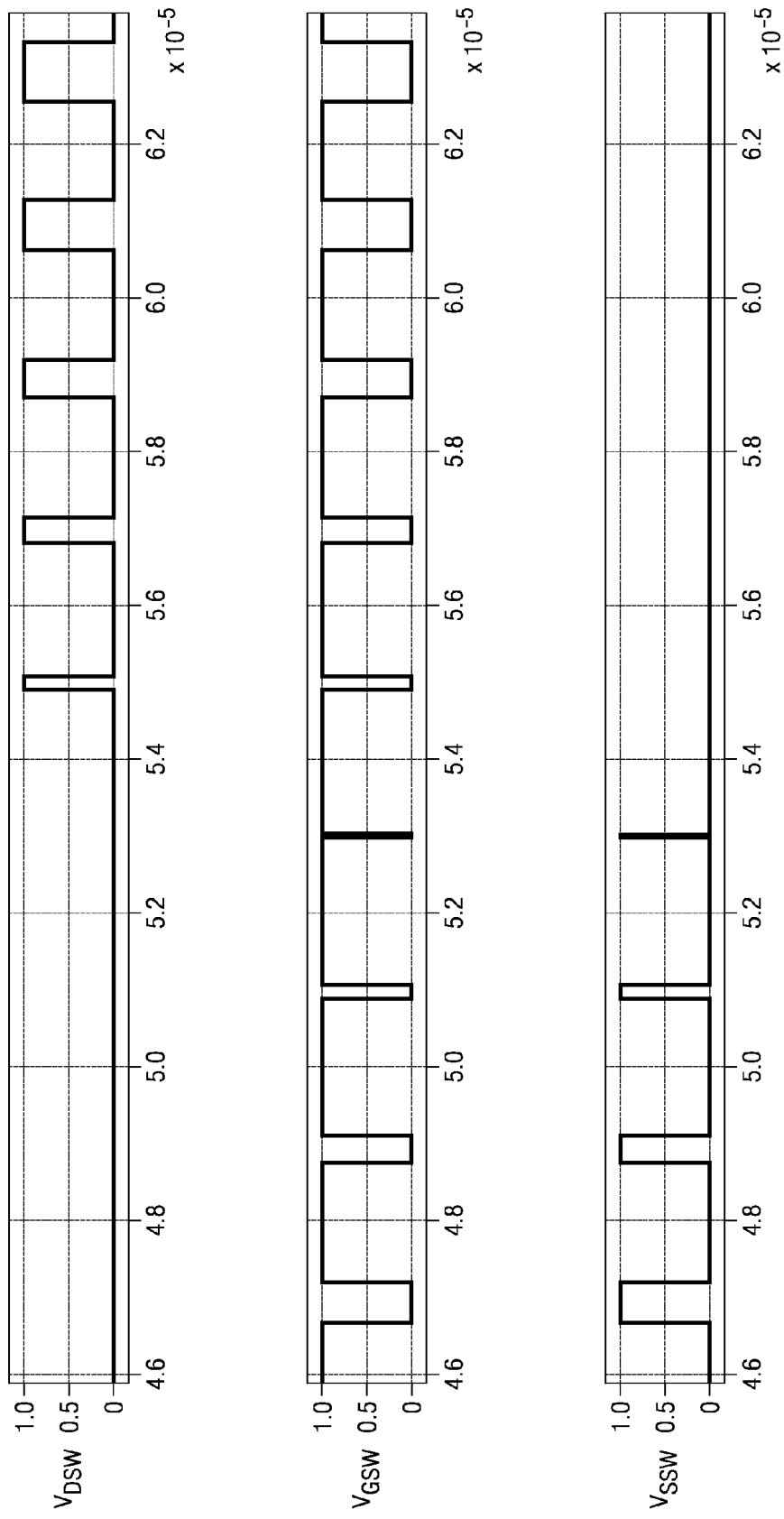
FIG. 6 is a graph depicting the positive PWM signal $V_{DSW}$, the neutral PWM signal $V_{GSW}$, and the negative PWM signal $V_{SSW}$, of FIG. 1.

Turning to FIG. 5, the ramp signals $V_{DRAMP}$ and $V_{SRAMP}$, the integrated signal $V_I$, and PWM signals $V_{DSW}$ and $V_{SSW}$ are shown. As can been seen, the more negative or more positive the integrated signal $V_I$ is, the wider the pulse widths of PWM signals $V_{DSW}$ and $V_{SSW}$ (respectively). Since ramp signals $V_{DRAMP}$ and $V_{SRAMP}$ are generally proportional to $V_{DD}$ and $V_{SS}$, respectively, the pulse widths for smaller output signals are typically wider than for the case where ramp signals $V_{DRAMP}$ and $V_{SRAMP}$ have a fixed amplitude. This increase in pulse width generally indicates longer actuation periods, the transistors $Q_1$ and $Q_3$, generally assisting decreasing distortion. Also, as can be seen in FIG. 6, the neutral PWM signal $V_{GSW}$ generally operates to ground the output node when both transistors $Q_1$ and $Q_3$ are "off," thus, generally preventing the load 106 from "floating."

Overall, the amplifier 100 offers better power dissipation and consumption characteristics as well as less distortion compared to other classes of amplifiers.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus that receives an analog input signal and outputs an output signal, the apparatus comprising:
   a power supply that receives a supply voltage and the analog input signal and that outputs a positive regulated signal and a negative regulated signal in response to the analog input signal;
   a carrier generator that receives the positive regulated signal and the negative regulated signal and that outputs a positive ramp signal and a negative ramp signal in response to the positive and negative regulated signals;
   a pulse generator that receives the analog input signal, the positive ramp signal, and the negative ramp signal and that outputs a plurality of pulse width modulation (PWM) signals; and
   a power stage that receives the plurality of PWM signals, the positive regulated signal, ground, and the negative regulated signal and that outputs the output signal.

2. The apparatus of claim 1, wherein the positive regulated signal is the greater of a first predetermined value and a first value within a first predetermined range above the output signal, and wherein the negative regulated signal is the lesser of a second predetermined value and a second value within a second predetermined range below the output signal.

3. The apparatus of claim 1, wherein the pulse generator further comprises:
   a subtractor that outputs a difference between the analog input signal and the output signal;
   an integrator that receives the difference between the analog input signal and the output signal;
   a first comparator that receives an output from the integrator and the positive ramp signal;
   a second comparator that receives the output from the integrator and the negative ramp signal; and
   switch control logic that receives outputs from the first and second comparators and that outputs the plurality of PWM signals.

4. The apparatus of claim 1, wherein the power stage further comprises three transistors, wherein each transistor receives at least one PWM signal at its control electrode.

5. The apparatus of claim 4, wherein the three transistors further comprise n-channel enhancement mode MOSFETs.

6. An apparatus comprising:
   a tracking power supply that receives a supply voltage and an analog input signal;
   a carrier generator that receives outputs from the tracking power supply and that outputs a positive ramp signal and a negative ramp signal, wherein the amplitudes of positive and negative ramp signals are proportional to the outputs of the tracking power supply; and
   a class D amplifier section that receives the analog input signal, the positive ramp signal, and the negative ramp signal and that outputs an output signal.

7. The apparatus of claim 6, wherein the tracking power supply further comprises a switch-mode power supply that receives the supply voltage and the analog input signal and that outputs the positive regulated signal and the negative regulated signal, wherein the positive regulated signal is the greater of a first predetermined value and a first value within a first predetermined range above the output signal, and wherein the negative regulated signal is the lesser of a second predetermined value and a second value within a second predetermined range below the output signal.

8. The apparatus of claim 6, wherein the class D amplifier section further comprises:
   a pulse generator that receives the analog input signal, the positive ramp signal, and the negative ramp signal and that outputs a plurality of PWM signals; and
   a power stage that receives the plurality of PWM signals, the positive regulated signal, ground, and the negative regulated signal and that outputs the output signal.

9. The apparatus of claim 8, wherein the pulse generator further comprises:
   a subtractor that outputs a difference between the analog input signal and the output signal;
   an integrator that receives the difference between the analog input signal and the output signal;

a first comparator that receives an output from the integrator and the positive ramp signal;

a second comparator that receives the output from the integrator and the negative ramp signal; and switch control logic that receives outputs from the first and second comparators and that outputs the plurality of PWM signals.

10. The apparatus of claim 8, wherein the power stage further comprises three transistors, wherein each transistor receives at least one PWM signal at its control electrode.

11. The apparatus of claim 10, wherein the three transistors further comprise n-channel enhancement mode MOSFETs.

12. An apparatus comprising:

a power supply that receives a supply voltage and an analog input signal and that outputs a positive regulated signal and a negative regulated signal, wherein the positive regulated signal is the greater of a first predetermined value and a first value within a first predetermined range above the output signal, and wherein the negative regulated signal is the lesser of a second predetermined value and a second value within a second predetermined range below the output signal;

a carrier generator including:

a phase section that receives the positive regulated signal and a positive ramp signal and that generates a plurality of phase signals;

a positive ramp generator that receives the positive regulated signal and the plurality of phase signals and that outputs the positive ramp signal; and a negative ramp generator that receives the negative regulated signal and the plurality of phase signals and that outputs a negative ramp signal;

a pulse generator that receives the analog input signal, the output signal, the positive ramp signal, and the negative ramp signal and that outputs a plurality of PWM signals; and a power stage that receives the plurality of PWM signals, the positive regulated signal, and the negative regulated signal and that outputs an output signal.

13. The apparatus of claim 12, wherein the power supply is a switched-mode power supply.

14. The apparatus of claim 12, wherein the pulse generator further comprises:

a subtractor that outputs a difference between the analog input signal and the output signal;

an integrator that receives the difference between the analog input signal and the output signal;

a first comparator that receives an output from the integrator and the positive ramp signal;

a second comparator that receives the output from the integrator and the negative ramp signal; and switch control logic that receives outputs from the first and second comparators and that outputs the plurality of PWM signals.

15. The apparatus of claim 14, wherein the pulse generator further comprises an NOR gate that receives the outputs from the first and second comparators and that outputs a signal to the switch control logic.

16. The apparatus of claim 12, wherein the power stage further comprises three transistors, wherein each transistor receives at least one PWM signal at its control electrode.

17. The apparatus of claim 12, wherein the phase section further comprises:

a first comparator that receives the positive regulated voltage and the positive ramp signal;

a second comparator that receives ground and the positive ramp signal;

a first NOR gate that receives an output from the first comparator, that receives a second phase signal of the plurality of phase signals and that outputs a first phase signal of the plurality of phase signals; and a second NOR gate that receives an output from the second comparator, that receives the first phase signal, and that outputs the second phase signal.

18. The apparatus of claim 12, wherein the power stage further comprises:

a first FET that receives the positive regulated signal at is drain and the output signal at its source, a first PWM signal of the plurality of PWM signals at its gate;

a second FET that is coupled to ground at is source and to the output signal at its drain, a second PWM signal of the plurality of PWM signals at its gate; and a third FET that receives the negative regulated signal at is source, is coupled to the output at its drain, and a third PWM signal of the plurality of PWM signals at its gate.

* * * * *